(12) United States Patent
Kim et al.

(10) Patent No.: US 11,778,810 B2
(45) Date of Patent: Oct. 3, 2023

(54) SEMICONDUCTOR DEVICE

(71) Applicant: Samsung Electronics Co., Ltd., Suwon-si (KR)

(72) Inventors: Jin A Kim, Hwaseong-si (KR); Ho-In Ryu, Suwon-si (KR); Kyo-Suk Chae, Suwon-si (KR); Joon Yong Choe, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/332,307

(22) Filed: May 27, 2021

(65) Prior Publication Data

US 2022/0085028 A1 Mar. 17, 2022

(30) Foreign Application Priority Data

Sep. 17, 2020 (KR) .................. 10-2020-0119799

(51) Int. Cl.
*H10B 12/00* (2023.01)

(52) U.S. Cl.
CPC .......... *H10B 12/34* (2023.02); *H10B 12/315* (2023.02); *H10B 12/482* (2023.02); *H10B 12/485* (2023.02)

(58) Field of Classification Search
None
See application file for complete search history.

(56) References Cited

U.S. PATENT DOCUMENTS

| | | | |
|---|---|---|---|
| 9,419,000 B2* | 8/2016 | Kim | H01L 27/10891 |
| 9,953,981 B2* | 4/2018 | Kim | H01L 27/10823 |
| 10,373,961 B2* | 8/2019 | Yoon | H01L 27/10814 |
| 10,566,332 B2* | 2/2020 | Wang | H01L 27/10888 |
| 2018/0166450 A1* | 6/2018 | Kim | H01L 27/10888 |
| 2018/0175040 A1* | 6/2018 | Kim | H01L 21/76224 |
| 2020/0194374 A1* | 6/2020 | Kim | H01L 23/535 |
| 2022/0102353 A1* | 3/2022 | Kim | H01L 23/5329 |
| 2022/0102528 A1* | 3/2022 | Kim | H01L 29/4236 |

FOREIGN PATENT DOCUMENTS

| | | |
|---|---|---|
| KR | 1999-0085754 A | 12/1999 |
| KR | 10-1116354 B1 | 3/2012 |
| KR | 10-2014-0007190 A | 1/2014 |
| KR | 10-2019-0035250 A | 4/2019 |
| KR | 10-2019-0053056 A | 5/2019 |

* cited by examiner

*Primary Examiner* — Steven M Christopher
(74) *Attorney, Agent, or Firm* — Harness, Dickey & Pierce, P.L.C.

(57) ABSTRACT

A semiconductor device may include a substrate including trenches and contact recesses having a curved surface profile, conductive patterns in the trenches, buried contacts including first portions filling the contact recesses and second portions on the first portions, and spacer structures including first and second spacers. The second portions may have a pillar shape and a smaller width than top surfaces of the first portions. The buried contacts may be spaced apart from the conductive patterns by the spacer structures. The first spacers may be on the first portions of the buried contacts at outermost parts of the spacer structures. The first spacers may extend along the second portions of the buried contacts and contact the buried contacts. The second spacers may extend along the side surfaces of the conductive patterns and the trenches. The second spacers may contact the conductive patterns. The first spacers may include silicon oxide.

20 Claims, 17 Drawing Sheets

SEMICONDUCTOR DEVICE

CROSS-REFERENCE TO RELATED APPLICATION

This application claims priority to Korean Patent Application No. 10-2020-0119799, filed on Sep. 17, 2020, and all the benefits accruing therefrom under 35 U.S.C. § 119, the disclosure of which is incorporated herein by reference in its entirety.

BACKGROUND

1. Field

The present disclosure relates to a semiconductor device.

2. Description of Related Art

As semiconductor devices are becoming highly integrated, individual circuit patterns for implementing as many semiconductor devices as possible in any given area are becoming more sophisticated.

Meanwhile, as the integration density of semiconductor memory devices increases, the influence of parasitic capacitances and/or leakage currents gradually increases. Since parasitic capacitances and leakage currents lower the operating properties of a semiconductor device, a semiconductor device capable of reducing and/or minimizing parasitic capacitances and leakage currents is needed.

SUMMARY

Embodiments of the present disclosure provide a semiconductor device with improved operating properties.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, a semiconductor device may include a substrate including trenches and contact recesses, the contact recesses having a curved surface profile; conductive patterns in the trenches, a width of the conductive patterns being smaller than a width of the trenches; buried contacts including first portions and second portions on the first portions, the first portions filling the contact recesses, and the second portions having a pillar shape, and a width of the second portions being smaller than a width of top surfaces of the first portions; and spacer structures on side surfaces of the conductive patterns. The spacer structures may include first spacers and second spacers. The buried contacts may be spaced apart from the conductive patterns by the spacer structures. The first spacers may be on the first portions of the buried contacts at outermost parts of the spacer structures. The first spacers may extend along the second portions of the buried contacts and contact the buried contacts. The second spacers may extend along the side surfaces of the conductive patterns and the trenches. The second spacers may contact the conductive patterns. The first spacers may include silicon oxide.

According to an embodiment of the present disclosure, a semiconductor device may include a substrate including isolation films and active regions defined by the isolation films, the active regions being arranged in a first direction; a plurality of buried contacts connected to the active regions and arranged in a second direction, the second direction different from the first direction, the plurality of buried contacts including first portions and second portions on the first portions, the first portions being depressed into the isolation films and the active regions, the second portions having a smaller width than top surfaces of the first portions, and having a pillar shape, a width of the first portions decreasing away from a top surface of the substrate; a plurality of bitline structures between the plurality of buried contacts and extending in a third direction across the active regions, the third direction intersecting the second direction, the plurality of bitline structures including first bitline structures overlapping the active regions and second bitline structures overlapping the isolation films, the first bitline structures and the second bitline structures being arranged such that the first portions of the plurality of buried contacts are between the first bitline structures and the second bitline structure; and spacer structures extending in the third direction along side surfaces of plurality of bitline structures. The spacer structures may include first spacers. The first spacers may include silicon oxide. The first spacers may be at outermost parts of the spacer structures and may extend along side surfaces of the second portions of the plurality of buried contacts.

According to an embodiment of the present disclosure, a semiconductor device may include a substrate including gate trenches; gate electrodes filling parts of the gate trenches and extending in a first direction; source/drain regions on side surfaces of the gate electrodes; buried contacts electrically connected to the source/drain regions and arranged in the first direction, the buried contacts including first portions and second portions, and landing pads on the buried contacts; a capacitor structure on the landing pads and electrically connected to the landing pads and the buried contacts; bitline structures extending in a second direction between the buried contacts, the second direction intersecting the first direction, the bitline structures being spaced apart from one another in the first direction, and the bitline structures including conductive patterns and capping patterns on the conductive patterns; and spacer structures on side surfaces of the bitline structures, the spacer structures extending in the second direction. In a cross-sectional view taken along the first direction, the first portions of the buried contacts may be depressed into the substrate and may have a semielliptical shape that bulges toward the substrate, and the second portions of the buried contacts may have a pillar shape with a smaller width than top surfaces of the first portions. The spacer structures may include first spacers and second spacers including silicon oxide. The second portions of the buried contacts may be spaced apart from the bitline structures by the spacer structures. The first spacers may contact the second portions of the buried contacts. The second spacers may contact the side surfaces of the bitline structures. Boundaries between the first portions and the second portions of the buried contacts may be located on bottom surfaces of the first spacers.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Figure 1:
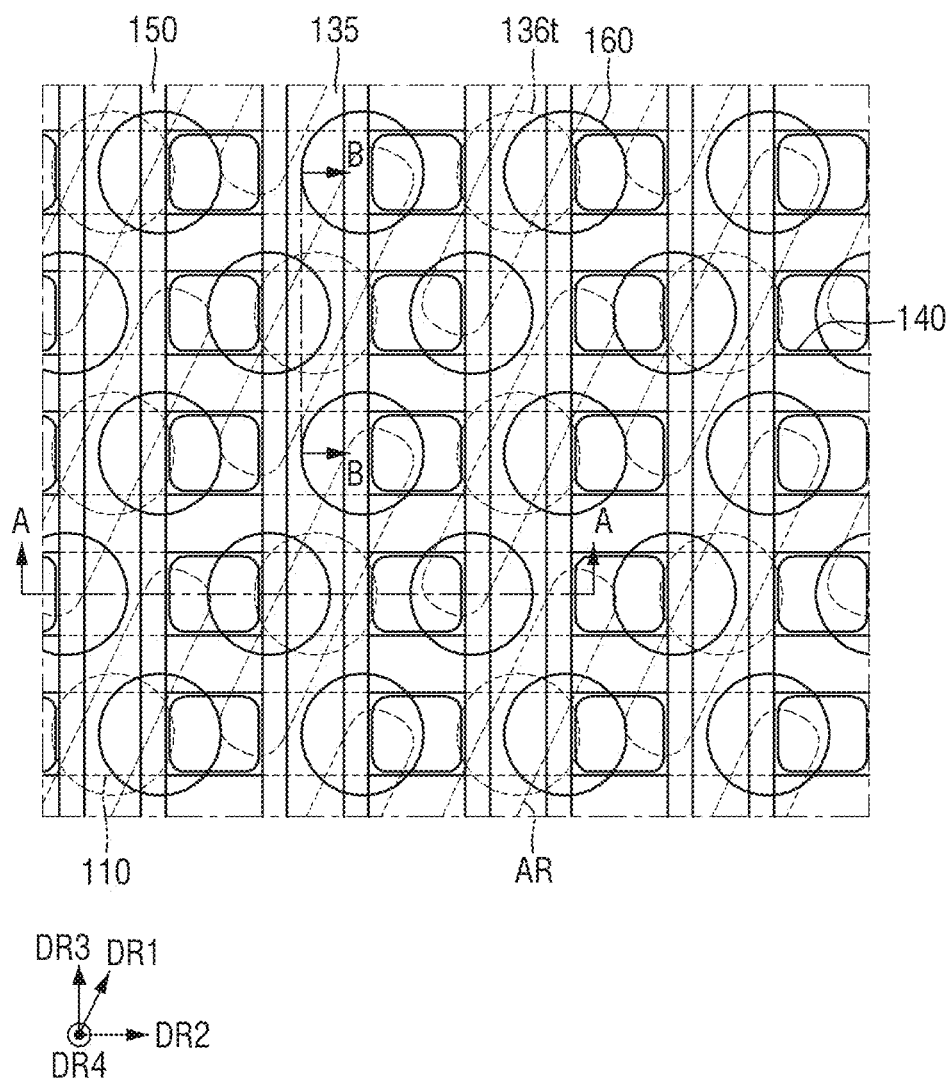
FIG. 1 is a layout view of a semiconductor device according to some embodiments of the present disclosure.
Figure 2:
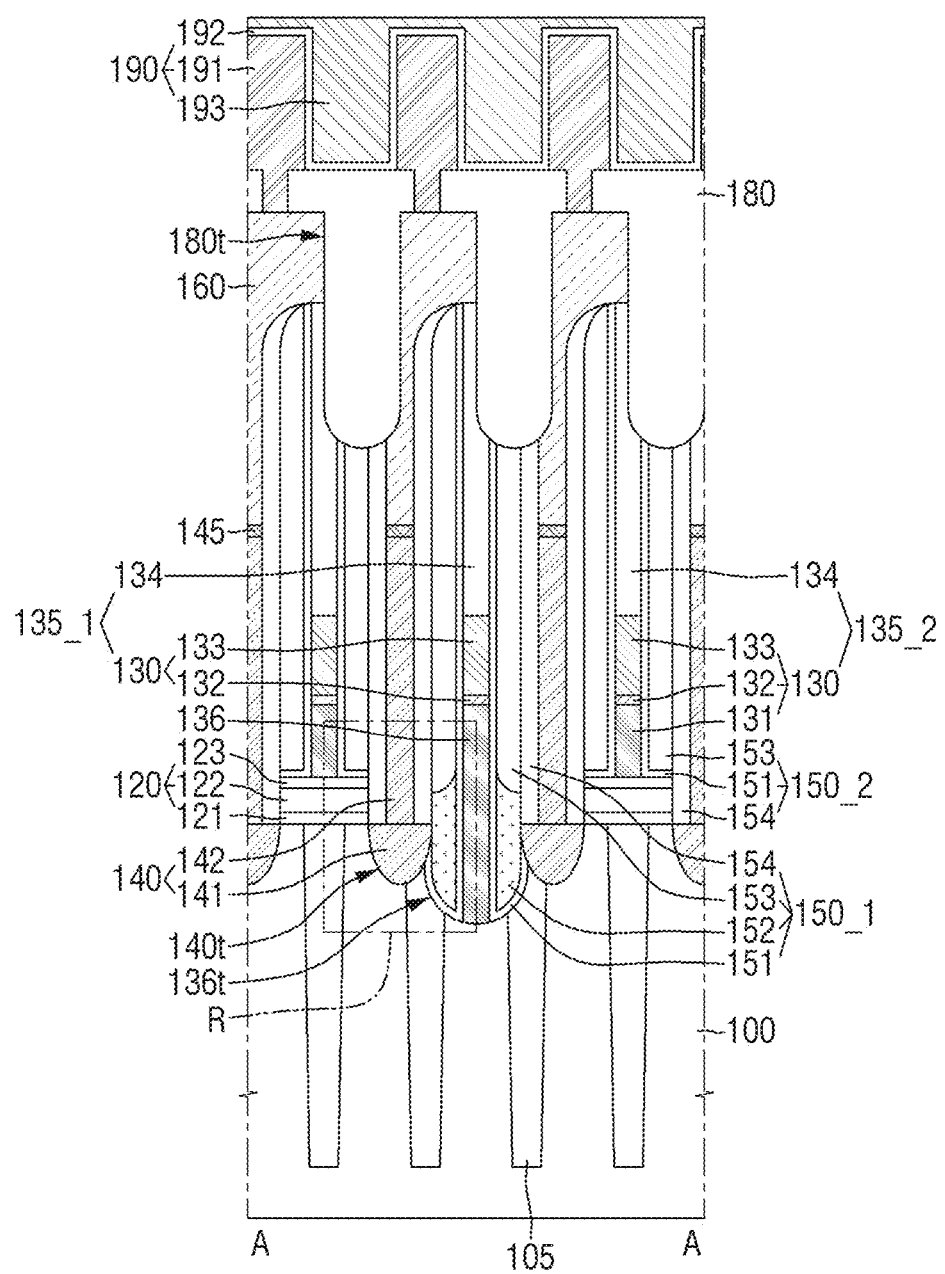
FIG. 2 is a cross-sectional view taken along line A-A of FIG. 1.
Figure 3:
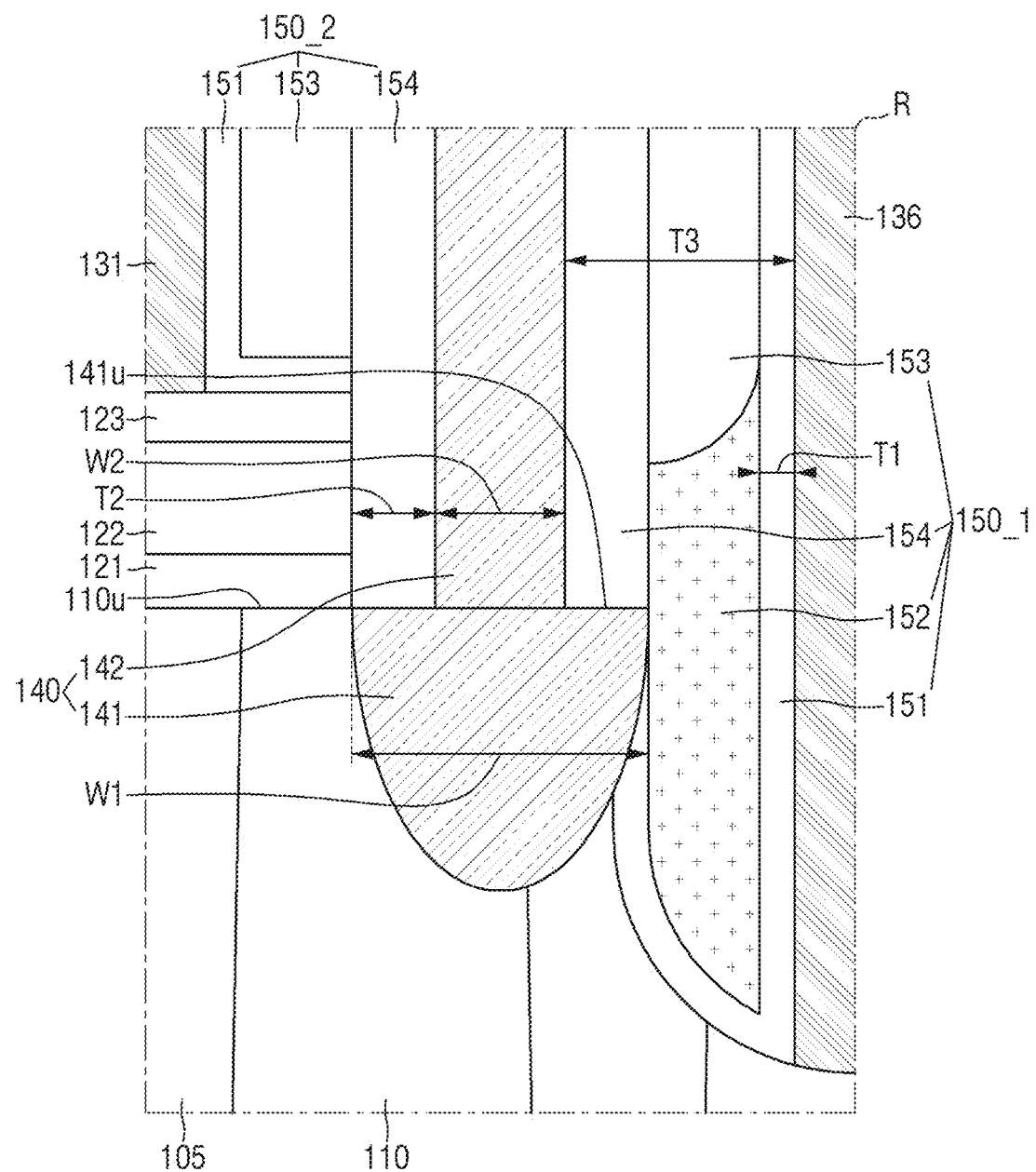
FIG. 3 is an enlarged cross-sectional view of an area R of FIG. 2.
Figure 4:
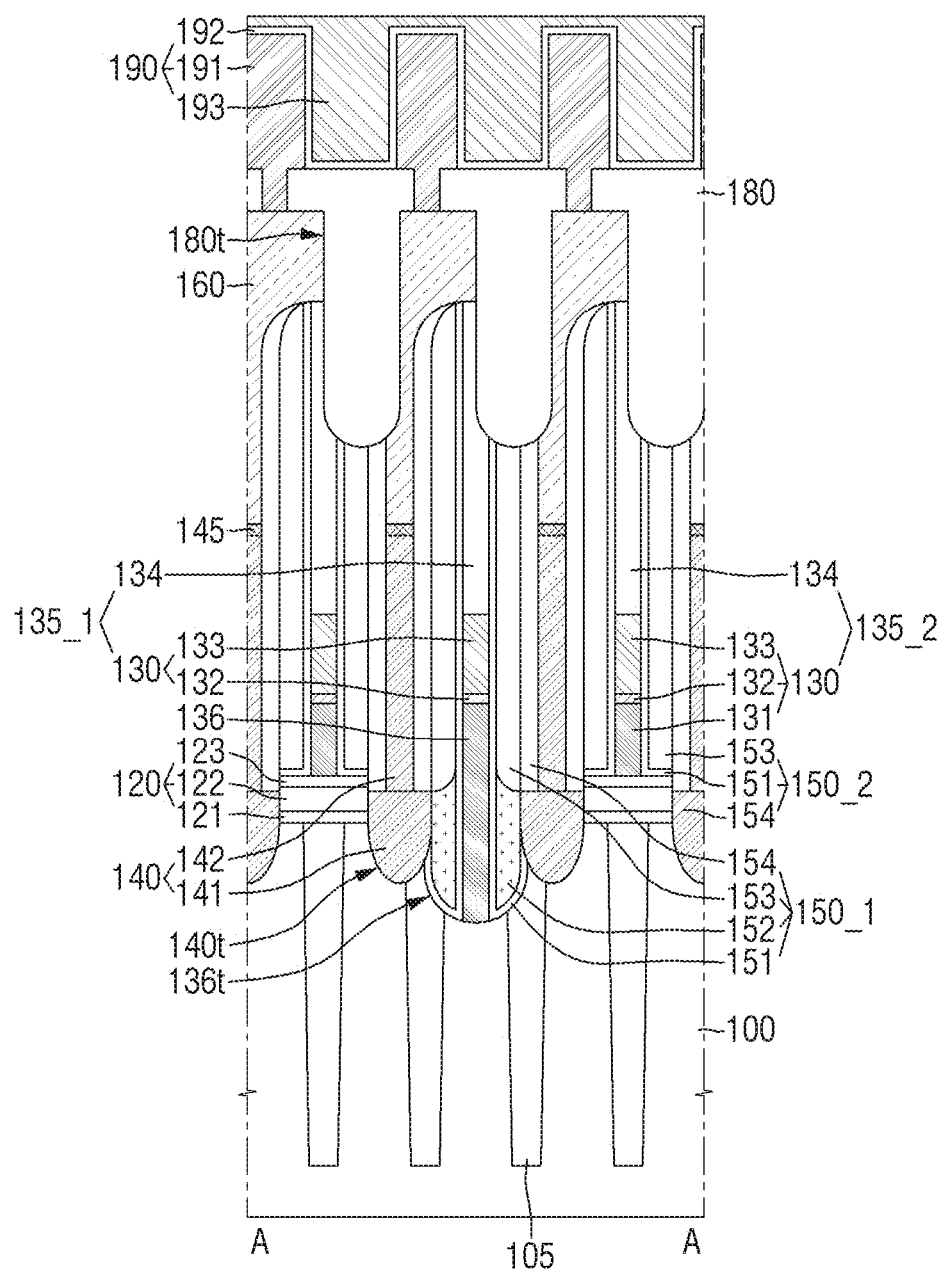
FIG. 4 is a cross-sectional view taken along B-B of FIG. 1.

FIG. 1 is a layout view of a semiconductor device according to some embodiments of the present disclosure. FIG. 2 is a cross-sectional view taken along line A-A of FIG. 1. FIG. 3 is an enlarged cross-sectional view of an area R of FIG. 2. FIG. 4 is a cross-sectional view taken along B-B of FIG. 1.

Referring to FIGS. 1 through 4, the semiconductor device according to some embodiments of the present disclosure may include a substrate 100, isolation films 105, wordline structures 110, insulating patterns 120, bitline structures (135_1 and 135_2), direct contacts 136, spacer structures (150_1 and 150_2), buried contacts 140, an interlayer insulating film 180, and a capacitor structure 190.

The substrate 100 may have a structure in which a base substrate and an epitaxial layer are stacked, but the present disclosure is not limited thereto. The substrate 100 may be a silicon substrate, a gallium arsenic substrate, a silicon germanium substrate, or a semiconductor-on-insulator (SOI) substrate. The substrate 100 will hereinafter be described as being a silicon substrate.

The substrate 100 may include active regions AR. As the design rule of the semiconductor device according to some embodiments of the present disclosure decreases, the active regions AR may be formed as diagonal bars. For example, as illustrated in FIG. 1, the active regions AR may be formed as bars that extend in a first direction DR1. The active regions AR may be arranged in the first direction DR1. The active regions AR may be arranged such that the center of one active region AR may be adjacent to ends of other active regions AR.

The active regions AR may include impurities and may function as source regions and drain regions. In some embodiments, the centers of the active regions AR may be electrically connected to first bitline structures 135_1 via the direct contacts 136, and both ends of each of the active regions AR may be electrically connected to the capacitor structure 190 via the buried contacts 140 and landing pads 160.

The isolation films 105 may define the active regions AR. Each of the isolation films 105 is illustrated as having inclined side surfaces, but the present disclosure is not limited thereto.

The isolation films 105 may include silicon oxide, silicon nitride, or a combination thereof, but the present disclosure is not limited thereto. The isolation films 105 may be single films formed of a single type of insulating material or may be multi-films formed of various types of insulating materials.

The wordline structures 110 may extend diagonally along a second direction DR2 across the active regions AR and the bitline structures 135. For example, the wordline structures 110 may diagonally cross the active regions AR and may perpendicularly cross the bitline structures 135. The wordline structures 110 may extend in parallel to one another. The wordline structures 110 may be spaced apart from one another at regular intervals.

In some embodiments, the wordline structures 110 may be buried in the substrate 100. For example, the substrate 100 may include gate trenches 110t, which extend in the second direction DR2. The wordline structures 110 may include gate dielectric films 111, first gate electrodes 112, second gate electrodes 113, and gate capping patterns 114.

The gate dielectric films 111 may extend along the sidewalls and the bottoms of the gate trenches 110t. The gate dielectric films 111 may extend along the profile of at least parts of the gate trenches 110t. The gate dielectric films 111 may include at least one of, for example, silicon oxide, silicon oxynitride, silicon nitride, and a high-k material having a greater dielectric constant than silicon oxide, but the present disclosure is not limited thereto.

The first gate electrodes 112 and the second gate electrodes 113 may be sequentially formed on the gate dielectric films 111. The first gate electrodes 112 and the second gate electrodes 113 may fill at least parts of the gate trenches 110t.

The wordline structures 110 are illustrated as multilayer structures including two gate electrodes, but the present disclosure is not limited thereto. Alternatively, the wordline structures 110 may include only one gate structure. The first gate electrodes 112 and the second gate electrodes 113 may include, for example, a metal, polysilicon, or a combination thereof, but the present disclosure is not limited thereto.

The gate capping patterns 114 may be formed on the second gate electrodes 113. The gate capping patterns 114 may fill parts of the gate trenches 110t that are not filled with the first gate electrodes 112 and the second gate electrodes 113. The gate dielectric films 111 are illustrated as extending along the sidewalls of the gate capping patterns 114, but the present disclosure is not limited thereto.

The gate capping patterns 114 may include at least one of, for example, silicon nitride (SiN), silicon oxynitride (SiON), silicon oxide (SiO$_2$), silicon carbonitride (SiCN), silicon oxycarbonitride (SiOCN), and a combination thereof.

The insulating patterns 120 may be formed on the substrate 100 and the isolation films 105. In some embodiments, the insulating patterns 120 may extend along the top surface of the substrate 100 and the top surfaces of the isolation films 105, in regions where the direct contacts 136 and the buried contacts 140 are not formed.

The insulating patterns 120 may be single films or may be multi-films, as illustrated. For example, the insulating patterns 120 may include first insulating films 121, second insulating films 122, and third insulating films 123, which are sequentially stacked on the substrate 100.

The first insulating films 121 may include, for example, silicon oxide. The second insulating films 122 may include a material having a different etching selectivity from the first insulating films 121. For example, the second insulating films 122 may include silicon nitride. The third insulating films 123 may include a material with a smaller dielectric constant than the second insulating films 122. For example, the third insulating films 123 may include silicon oxide.

The bitline structures (135_1 and 135_2) may be formed on the substrate 100 and the isolation films 105. The bitline structures (135_1 and 135_2) may extend diagonally along a third direction DR3 across the active regions AR and the wordline structures 110. For example, the bitline structures (135_1 and 135_2) may diagonally cross the active regions AR and may perpendicularly cross the wordline structures 110. The bitline structures (135_1 and 135_2) may extend in parallel to one another. The bitline structures (135_1 and 135_2) may be spaced apart from one another at regular intervals.

The bitline structures (135_1 and 135_2) may include first bitline structures 135_1, which overlap with the substrate 100, and second bitline structures 135_2, which overlap with the isolation films 105. The first bitline structures 1351 may be formed on the direct contacts 136. The second bitline structures 135_2 may be formed on the insulating patterns 120.

The bitline structures (135_1 and 135_2) may include conductive patterns 130 and capping patterns 134, which are sequentially disposed on the substrate 100.

The conductive patterns 130 may be single films or may be multi-films, as illustrated. For example, the conductive patterns 130 may include first conductive films 131, second conductive films 132, and third conductive films 133, which are sequentially stacked on the substrate 100.

The first conductive films 131, the second conductive films 132, and the third conductive films 133 may include, for example, polysilicon, TiN, TiSiN, tungsten, tungsten silicide, or a combination thereof, but the present disclosure is not limited thereto. For example, the first conductive films 131 may include polysilicon, the second conductive films 132 may include TiSiN, and the third conductive films 133 may include tungsten.

The capping patterns 134 may be formed on the conductive patterns 130. For example, the capping patterns 134 may be formed on the third conductive films 133. The capping patterns 134 may include silicon nitride, but the present disclosure is not limited thereto.

The direct contacts 136 may penetrate the insulating patterns 120 to connect the active regions AR of the substrate 100 and the bitline structures (135_1 and 135_2). The direct contacts 136 may penetrate the insulating patterns 120 in a fourth direction DR4. For example, the substrate 100 may include the active regions AR and first trenches 136t, which are formed in the isolation films 105. The first trenches 136t may penetrate the insulating patterns 120 to expose at least parts of the active regions AR. The direct contacts 136 may be formed in the first trenches 136t to connect the active regions AR and the conductive patterns 130.

In some embodiments, as illustrated in FIG. 1, the first trenches 136t may expose the centers of the active regions AR. Accordingly, the direct contacts 136 may overlap with the centers of the active regions AR. Also, the first bitline structures 135_1, which are disposed on the direct contacts 136, may overlap with the centers of the active regions AR. In some embodiments, some of the first trenches 136t may overlap with parts of the isolation films 105. Accordingly, the first trenches 136t may expose not only parts of the substrate 100, but also parts of the isolation films 105.

The direct contacts 136 may include a conductive material. Accordingly, the conductive patterns 130 of the bitline structures (135_1 and 135_2) may be electrically connected to the active regions AR of the substrate 100. The active regions AR of the substrate 100 that are connected to the conductive patterns 130 and the direct contacts 136 may serve as source regions and drain regions.

In some embodiments, the direct contacts 136 may include the same material as the first conductive films 131. For example, the direct contacts 136 may include polysilicon, but the present disclosure is not limited thereto. In another example, the direct contacts 136 may include a different material from the first conductive films 131.

In some embodiments, the width of the direct contacts 136 may be smaller than the width of the first trenches 136t. For example, as illustrated in FIG. 2, the direct contacts 136 may overlap only with parts of the substrate 100 that are exposed by the first trenches 136t. The direct contacts 136 may be arranged at the centers of the parts of the substrate 100 that are exposed by the first trenches 136t.

In some embodiments, the width of the bitline structures (135_1 and 135_2) may be smaller than the width of the first trenches 136t. For example, the width of the bitline structures (135_1 and 135_2) may be substantially the same as the width of the direct contacts 136.

The buried contacts 140 may be formed on the substrate 100, between the bitline structures (135_1 and 135_2). For example, as illustrated in FIG. 2, the buried contacts 140 may be interposed in regions defined by the wordline structures 110 and the bitline structures (135_1 and 135_2). The buried contacts 140 may form a plurality of isolated regions that are spaced apart from one another. The buried contacts 140 may be arranged in the first and second directions DR1 and DR2.

The buried contacts 140 may penetrate the insulating patterns 120 to connect the active regions AR of the substrate 100 and the landing pads 160. For example, the substrate 100 may include contact recesses 140t in the active regions AR. The contact recesses 140t may penetrate the insulating patterns 120 to expose parts of the active regions AR. The buried contacts 140 may be formed in the contact recesses 140t to connect the active regions AR of the substrate 100 and the landing pads 160.

In some embodiments, the contact recesses 140t may expose both ends of each of the active regions AR. Accordingly, as illustrated in FIG. 1, the buried contacts 140 may be connected to both ends of each of the active regions AR. Parts of the contact recesses 140t may overlap with parts of the isolation films 105. Accordingly, the contact recesses 140*t* may expose not only parts of the substrate 100, but also parts of the isolation films 105.

The buried contacts 140 may include first portions 141 and second portions 142.

The first portions 141 may fill at least parts of the contact recesses 140*t*. The contact recesses 140*t* may have a curved surface profile. The contact recesses 140*t* may have, for example, a curved surface profile that bulges toward the substrate 100. In other words, the width, in the second direction DR2, of the contact recesses 140*t* may increase away from a top surface 100*u* of the substrate 100. Accordingly, the first portions 141 may correspond to parts of the buried contacts 140 that are depressed into the isolation films 105 and the active regions AR, between the first bitline structures 135_1 and the second bitline structures 135_2. The first portions 141 may have a semielliptical shape that bulges toward the substrate 100. Also, a first width W1, in the second direction DR2, of the first portions 141 may increase away from the top surface 100*u* of the substrate 100.

The second portions 142 may be disposed on the first portions 141. A second width W2, in the second direction DR2, of the second portions 142 may be smaller than the first width W1, in the second direction DR2, of the first portions 141. The second portions 142 may have a pillar shape having the second width W2 in the second direction R2.

In some embodiments, top surfaces 141*u* of the first portions 141 may be placed on substantially the same plane as the top surface 100*u* of the substrate 100. That is, the boundaries between the first portions 141 and the second portions 142 may be placed on the top surface 100*u* of the substrate 100.

The buried contacts 140 may include a conductive material. Accordingly, the buried contacts 140 may be electrically connected to the active regions AR of the substrate 100. The active regions AR of the substrate 100 that are connected to the buried contacts 140 may function as source regions and drain regions. The buried contacts 140 may include, for example, polysilicon, but the present disclosure is not limited thereto. Thus, the boundaries between the first portions 141 and the second portions 142 of the buried contacts 140 may be indistinguishable.

The spacer structures (150_1 and 150_2) may be disposed on side surfaces of the bitline structures (135_1 and 135_2). The spacer structures (150_1 and 150_2) may extend along the side surfaces of the bitline structures (135_1 and 135_2). As illustrated in FIG. 1, the spacer structures (150_1 and 150_2) may extend in the third direction DR3. That is, the buried contacts 140 may be spaced apart from the bitline structures (135_1 and 135_2) by the spacer structures (150_1 and 150_2).

The spacer structures (150_1 and 150_2) may include first spacer structures 150_1, which are disposed on the side surfaces of the first bitline structures 135_1, and second spacer structures 150_2, which are disposed on the side surfaces of the second bitline structures 135_2. That is, the buried contacts 140 may be disposed between the first spacer structures 150_1 and the second spacer structures 150_2.

Parts of the first spacer structures 1501 may be disposed in the first trenches 136*t*. For example, as illustrated in FIG. 2, lower parts of the first spacer structures 150_1 may extend along the side surfaces of the buried contacts 140. Lower parts of the buried contacts 140 may fill parts of the first trenches 136*t*, and the lower parts of the first spacer structures 150_1 may fill the rest of the first trenches 136*t*. The second spacer structures 150_2 may be disposed on the insulating patterns 120.

The spacer structures (150_1 and 150_2) may be single films or may be multi-films, as illustrated in FIG. 2. For example, the first spacer structures 150_1 may include first spacers 151, second spacers 152, third spacers 153, and fourth spacers 154, and the second spacer structures 150_2 may include first spacers 151, third spacers 153, and fourth spacers 154.

The first spacers 151 may extend along at least parts of the side surfaces of the bitline structures (135_1 and 135_2). The first spacers 151 of the first spacer structures 1501 may extend along the side surfaces of the direct contacts 136, the side surfaces of the first bitline structures 135_1, and the first trenches 136*t*. The first spacers 151 of the second spacer structures 150_2 may extend along the side surfaces of the second bitline structures 135_2 and the top surfaces of the insulating patterns 120. The first spacers 151 of the first bitline structures 150_1 may be in contact with at least parts of the direct contacts 136 and at least parts of the first bitline structures 135_1. The first spacers 151 of the second spacer structures 150_2 may be in contact with at least parts of the second bitline structures 135_2.

The second spacers 152 are disposed on the first spacers 151. The second spacers 152 may fill the first trenches 136*t*. The second spacers 152 may fill parts of the first trenches 136*t* that are not filled with the direct contacts 136 and the first spacers 151.

The first trenches 136*t* may expose at least parts of the first portions 141 of the buried contacts 140. For example, the first trenches 136*t* may at least partially expose upper parts of the first portions 141. Accordingly, at least parts of the first portions 141 may be in contact with the second spacers 152.

In some embodiments, the top surfaces 141*u* of the first portions 141 may be located below the top surfaces of the second spacers 152.

The third spacers 153 may be disposed on the first or second spacers 151 or 152. The third spacers 153 may be disposed between the first spacers 151 and the fourth spacers 154 and may fill the gaps between the first spacers 151 and the fourth spacers 154. The third spacers 153 of the first spacers 151 may extend along at least parts of the side surfaces of the direct contacts 136 and at least parts of the side surfaces of the first bitline structures 135_1. The third spacers 153 of the second spacer structures 150_2 may extend at least parts of the side surfaces of the second bitline structures 135_2.

The fourth spacers 154 may be formed on the second or third spacers 152 or 153. The fourth spacers 154 of the first spacer structures 150_1 may extend along at least parts of the side surfaces of the direct contacts 136 and at least parts of the side surfaces of the first bitline structures 135_1. The fourth spacers 154 of the second spacer structures 150_2 may extend at least parts of the side surfaces of the second bitline structures 135_2. The fourth spacers 154 of the first spacer structures 150_1 may be in contact with at least parts of the second spacers 152 and at least parts of the third spacers 153. The fourth spacers 154 of the second spacer structures 150_2 may be in contact with at least parts of the first spacers 151 and at least parts of the third spacers 153.

The fourth spacers 154 may be disposed at the outermost parts of the spacer structures (150_1 and 150_2). The fourth spacers 154 may be disposed on the buried contacts 140. The fourth spacers 154 may be disposed on the top surfaces 141*u* of the first portions 141 of the buried contacts 140. Bottom surfaces 154b of the fourth spacers 154 may be in contact with the top surfaces 141u of the first portions 141 of the buried contacts 140. The bottom surfaces 154b of the fourth spacers 154 may be located at the boundaries between the first portions 141 and the second portions 142 of the buried contacts 140.

The fourth spacers 154 may extend along the side surfaces of the second portions 142 of the buried contacts 140, on the first portions 141 of the buried contacts 140. The fourth spacers 154 may be in contact with the side surfaces of the second portions 142 of the buried contacts 140. Accordingly, at least parts of the first portions 141 of the buried contacts 140 may be disposed between the first spacers 151 and the fourth spacers 154 of the first spacer structures 150_1. The first spacers 151 and the fourth spacers 154 of the first spacer structures 150_1 may be separated by the first portions 141 of the buried contacts 140.

In some embodiments, the first spacers 151, the third spacers 153, and the fourth spacers 154 may be formed of the same material, and the second spacers 152 may be formed of a different material from the first spacers 151, the third spacers 153, and the fourth spacers 154. The first spacers 151, the third spacers 153, and the fourth spacers 154 may be formed of silicon oxide, and the second spacers 152 may be formed of silicon nitride. The boundaries between the first spacers 151, the third spacers 153, and the fourth spacers 154 may be distinguishable or indistinguishable.

Accordingly, the side surfaces of the bitline structures (135_1 and 135_2) and the side surfaces of the direct contacts 136 may be in contact with the first spacers 151, which are formed of silicon oxide, and the side surfaces of the second portions 142 of the buried contacts 140 may be in contact with the fourth spacers 154, which are disposed at the outermost parts of the spacer structures (150_1 and 150_2) and are formed of silicon oxide. That is, the bitline structures (135_1 and 135_2), the side surfaces of the direct contacts 136, and the side surfaces of the second portions 142 of the buried contacts 140 may all be in contact with spacers that are formed of silicon oxide.

A first thickness T1 of spacers that are in contact with the lower parts of the direct contacts 136 and are formed of silicon oxide, a second thickness T2 of spacers that are in contact with the lower parts of the second portions 142 of the buried contacts 140 and are formed of silicon oxide, and a third thickness T3 of spacers that are in contact with the upper parts of the direct contacts 136, the side surfaces of the bitline structures (135_1 and 135_2) or the upper parts of the second portions 142 of the buried contacts 140 and are formed of silicon oxide may all differ from one another. For example, as illustrated in FIG. 3, the first thickness T1 may be smaller than the second thickness T2, and the second thickness T2 may be smaller than the third thickness T3. In another example, the first thickness T1 may be greater than the second thickness T2 and smaller than the third thickness T3.

In a case where the spacers that are in contact with the direct contacts 136 and/or the buried contacts 140 are formed of silicon nitride, the silicon nitride may form interface traps by being in contact with the depletion regions of the direct contacts 136 and/or the buried contacts 140. The interface traps may increase the resistance of the direct contacts 136 and/or the buried contacts 140 and may increase a leakage current. As the integration density of a semiconductor device increases, the influence of parasitic capacitances and leakage currents on the semiconductor device gradually increases. For example, as the distance between conductive patterns of a dynamic random access memory (DRAM) decreases, the parasitic capacitance between the conductive patterns may increase.

However, since the direct contacts 136 and/or the buried contacts 140 are in contact with spacers that are formed of silicon oxide, the formation of interface traps can be reduced. As a result, the resistance of the direct contacts 136 and/or the buried contacts 140 may decrease, and a leakage current may also decrease. Also, since the parasitic capacitance of the semiconductor device according to some embodiments of the present disclosure can be effectively reduced by the spacers that are formed of silicon oxide, the operating properties of the semiconductor device according to some embodiments of the present disclosure can be improved.

Silicide layers 145 may be formed on the buried contacts 140. The silicide layers 145 may cover parts of the top surfaces of the buried contacts 140. Alternatively, as illustrated in FIG. 2, the silicide layers 145 may cover the entire top surfaces of the buried contacts 140. In some embodiments, the silicide layers 145 may not be provided on the buried contacts 140 and the landing pads 160. The silicide layers 145 may include, for example, cobalt silicon ($CoSi_x$), but the present disclosure is not limited thereto.

The landing pads 160 may be formed on the silicide layers 145. The landing pads 160 may be electrically connected to the buried contacts 140 via the silicide layers 145. In some embodiments, the top surfaces of the landing pads 160 may be located above the top surfaces of the bitline structures (135_1 and 135_2). For example, the landing pads 160 may cover parts of the top surfaces of the bitline structures (135_1 and 135_2).

The landing pads 160 may form a plurality of isolated regions that are spaced apart from one another. FIG. 1 illustrates that the landing pads 160 have a circular shape, but the present disclosure is not limited thereto. FIG. 1 also illustrates that the landing pads 160 are arranged in a honeycomb fashion, but the present disclosure is not limited thereto.

The landing pads 160 may be connected to the buried contacts 140, which also form a plurality of isolated regions. For example, the landing pads 160 may be separated by second trenches 180t.

The landing pads 160 may include a conductive material. Accordingly, the capacitor structure 190 may be electrically connected to the active regions AR of the substrate 100. The landing pads 160 may include, for example, tungsten (W), but the present disclosure is not limited thereto.

In some embodiments, some of the second trenches 180t may expose parts of the bitline structures (135_1 and 135_2). For example, the second trenches 180t may extend from the top surfaces of the landing pads 160 to a height below the top surfaces of the bitline structures (135_1 and 135_2). Accordingly, the landing pads 160 may be separated by the bitline structures (135_1 and 135_2) and the second trenches 180t. In some embodiments, the bottoms of the second trenches 180t may be formed to be above the bottom surfaces of the capping patterns 134. Accordingly, the second trenches 180t may expose parts of the capping patterns 134.

As the spacer structures (150_1 and 150_2) are interposed between the bitline structures (135_1 and 135_2) and the buried contacts 140, the second trenches 180t may expose parts of the top surfaces of the first spacers 151, parts of the top surfaces of the third spacers 153, and parts of the top surfaces of the fourth spacers 154.

The interlayer insulating film 180 may be formed on parts of the top surfaces of the landing pads 160 and parts of the bitline structures (135_1 and 135_2). The interlayer insulating film 180 may define the landing pads 160, which form a plurality of isolated regions. For example, the interlayer insulating film 180 may fill the second trenches 180t. Accordingly, the interlayer insulating film 180 may separate the landing pads 160. The interlayer insulating film 180 may be patterned to expose parts of the top surfaces of the landing pads 160.

The interlayer insulating film 180 may include an insulating material and may thus electrically isolate the landing pads 160. For example, the interlayer insulating film 180 may include at least one of silicon oxide, silicon oxynitride, silicon nitride, and a low-k material having a smaller dielectric constant than silicon oxide, but the present disclosure is not limited thereto.

The capacitor structure 190 may be disposed on the interlayer insulating film 180 and the landing pads 160. The capacitor structure 190 may be in contact with parts of the top surfaces of the landing pads 160 that are exposed by the interlayer insulating film 180. As a result, the capacitor structure 190 may be electrically connected to source regions and drain regions that are connected to the landing pads 160, the silicide layers 145, and the buried contacts 140. Therefore, the capacitor structure 190 can store electric charge in a semiconductor memory device or the like.

For example, as illustrated in FIGS. 2 and 4, the capacitor structure 190 may include lower electrodes 191, a capacitor dielectric film 192, and an upper electrode 193. The capacitor structure 190 may store electric charge in the capacitor dielectric film 192 with the use of the difference in electric potential between the lower electrodes 191 and the upper electrode 193.

The lower electrodes 191 and the upper electrode 193 may include, for example, doped polysilicon, a metal, or a metal nitride, but the present disclosure is not limited thereto. The capacitor dielectric film 192 may include, for example, silicon oxide or a high-k material, but the present disclosure is not limited thereto.

Figure 5:
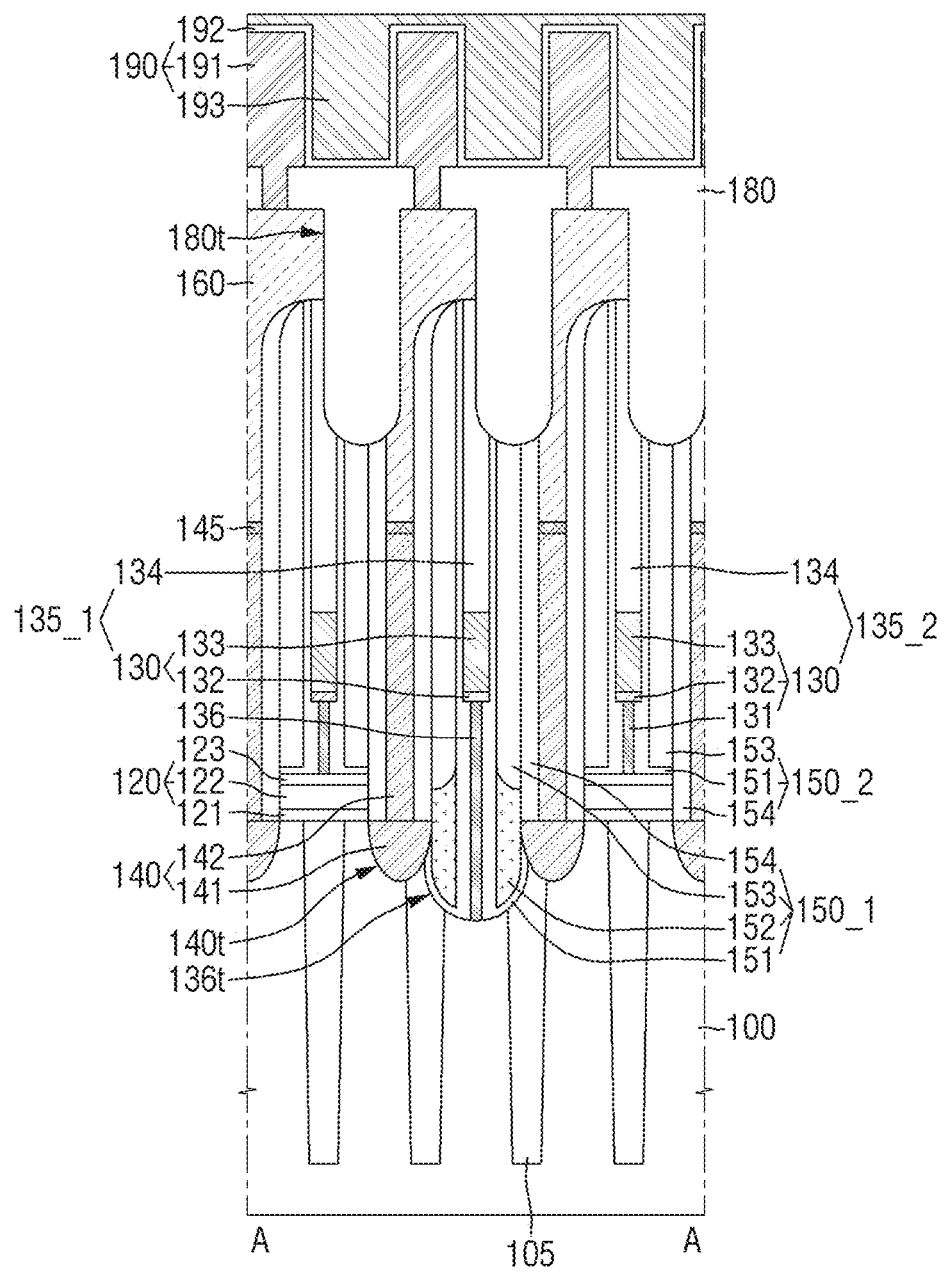
FIG. 5 is a cross-sectional view of a semiconductor device according to some embodiments of the present disclosure.

FIG. 5 is a cross-sectional view of a semiconductor device according to some embodiments of the present disclosure. For convenience, descriptions of elements or features that have already been described above with reference to FIGS. 1 through 4 will be omitted or simplified.

Referring to FIG. 5, the top surfaces of first portions 141 of buried contacts 140 may be located above the top surface of a substrate 100.

As illustrated in FIG. 5, the top surfaces of the first portions 141 of the buried contacts 140 may be located below the uppermost top surfaces of second spacers 152. Alternatively, the top surfaces of the first portions 141 of the buried contacts 140 may be located above the uppermost top surfaces of second spacers 152.

Figure 6:
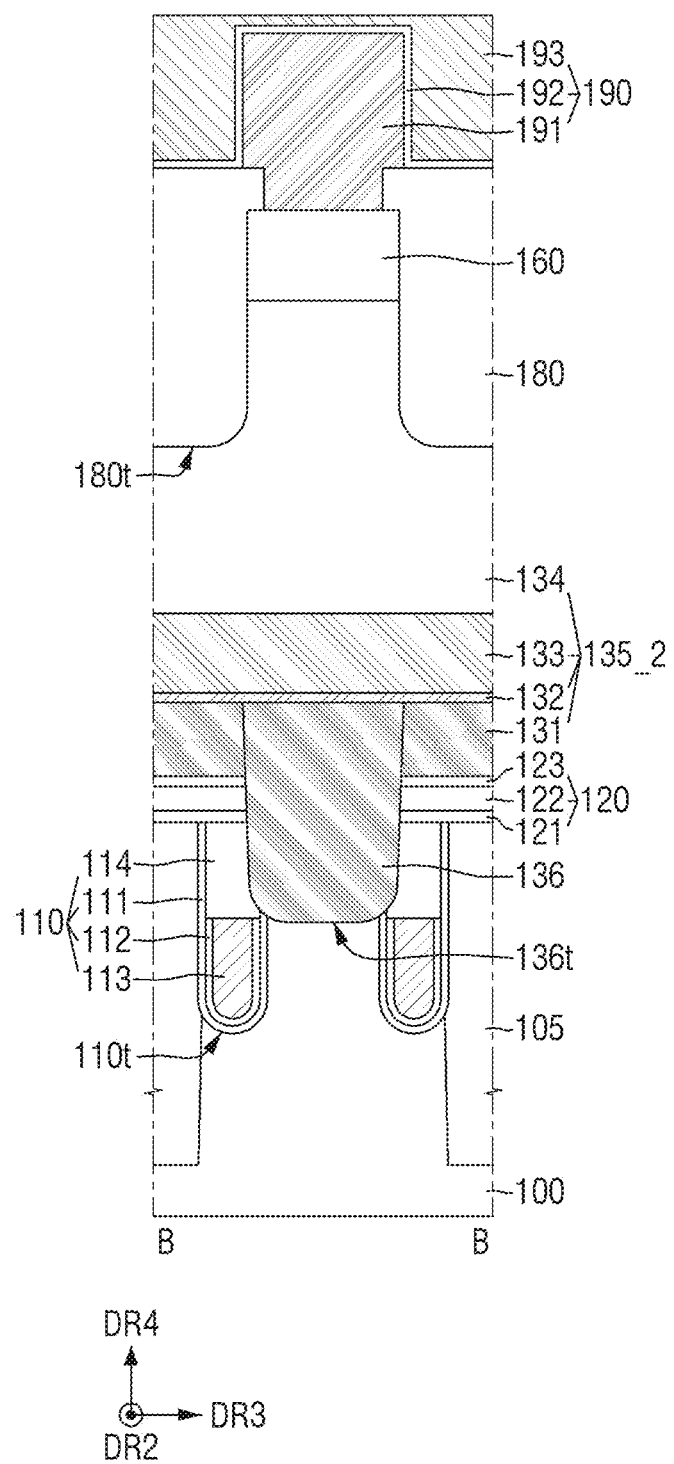
FIG. 6 is a cross-sectional view of a semiconductor device according to some embodiments of the present disclosure.

FIG. 6 is a cross-sectional view of a semiconductor device according to some embodiments of the present disclosure. For convenience, descriptions of elements or features that have already been described above with reference to FIGS. 1 through 4 will be omitted or simplified.

Referring to FIG. 6, the width of direct contacts 136 may differ from the width of bitline structures (135_1 and 135_2). The width of the direct contacts 136 may be smaller than the width of the bitline structures (135_1 and 135_2).

For example, the width of first conductive films 131 may be smaller than the width of the bitline structures (135_1 and 135_2). The width of the first conductive films 131 may be substantially the same as, or greater than, the width of the direct contacts 136.

FIGS. 7 through 15 are cross-sectional views illustrating a method of fabricating a semiconductor device according to some embodiments of the present disclosure. For convenience, descriptions of elements or features that have already been described above with reference to FIGS. 1 through 4 will be omitted or simplified. FIGS. 7 through 15 are cross-sectional views taken along line A-A of FIG. 1.

Figure 7:
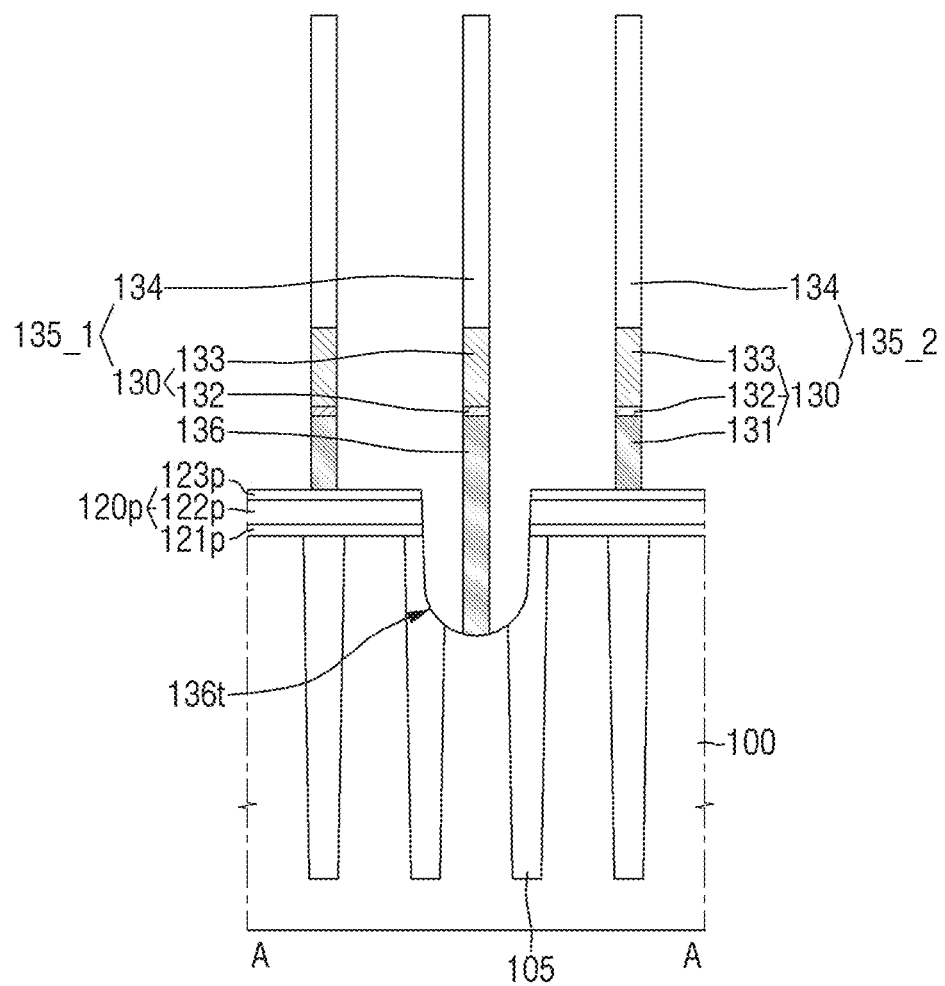
FIGS. 7 through 15 are cross-sectional views illustrating a method of fabricating a semiconductor device according to some embodiments of the present disclosure.

Referring to FIG. 7, pre-insulating patterns 120p, conductive patterns 130, direct contacts 136, and capping patterns 134 are formed on a substrate 100 and isolation films 105.

For example, first, second, and third pre-insulating films 121p, 122p, and 123p and a first pre-conductive film may be sequentially formed on the substrate 100 and the isolation films 105. Thereafter, first trenches 136t, which expose some of the active regions AR of FIG. 1, may be formed in the substrate 100. In some embodiments, the first trenches 136t may expose the centers of the active regions AR. Thereafter, pre-direct contacts, which fill the first trenches 136t, may be formed. Thereafter, a second pre-conductive film, a third pre-conductive film, and pre-capping patterns may be sequentially formed on the first pre-conductive film and the pre-direct contacts.

Thereafter, the first pre-conductive film, the second pre-conductive film, the third pre-conductive film, the pre-direct contacts, and the pre-capping patterns may be patterned. Accordingly, bitline structures (135_1 and 135_2) may be formed to extend in the third direction DR3 of FIG. 1 across the active regions AR of FIG. 1 and the wordline structures 110 of FIG. 1. In some embodiments, the width of the bitline structures (135_1 and 135_2) and the width of the direct contacts 136 may be formed to be smaller than the width of the first trenches 136t. That is, the patterned bitline structures (135_1 and 135_2) and the patterned direct contacts 136 may not fill the first trenches 136t.

Figure 8:
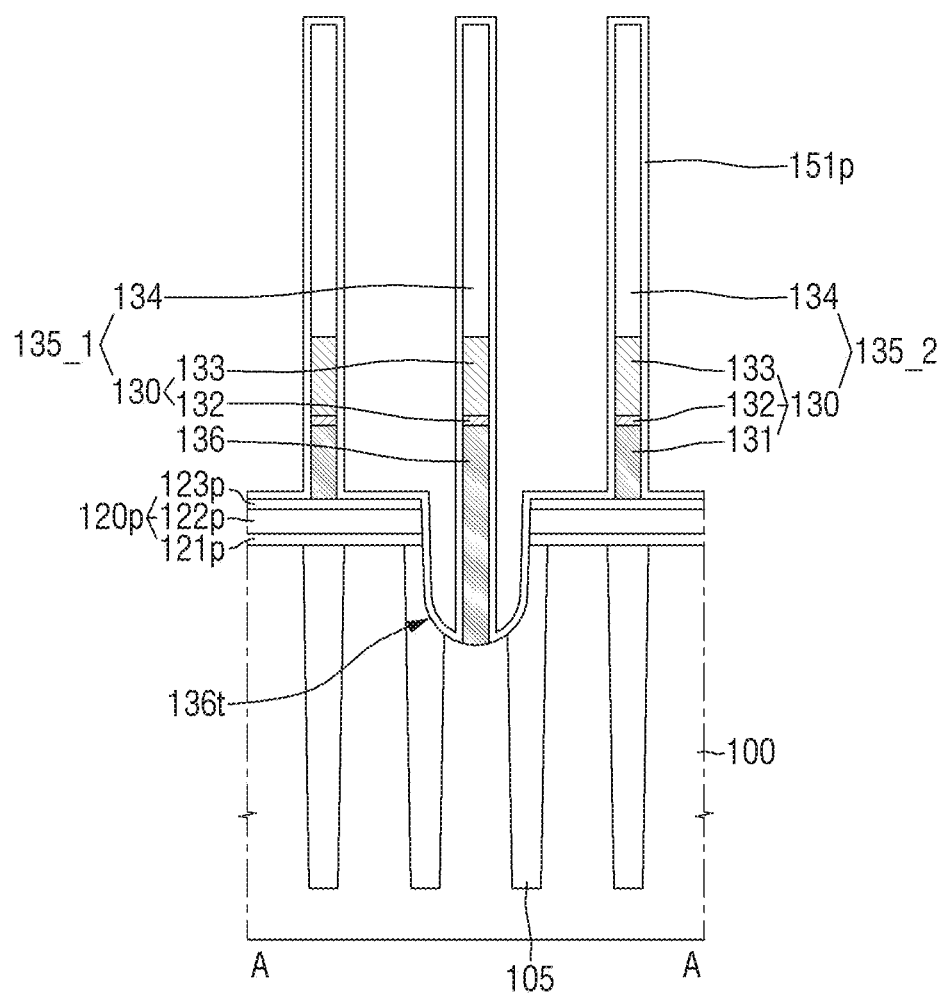

Referring to FIG. 8, the first pre-spacer film 151p may be conformally formed. The first pre-spacer film 151p may extend along the side surfaces and the top surfaces of the bitline structures (135_1 and 135_2), the side surfaces of the direct contacts 136, the side surfaces and the top surfaces of the insulating patterns 120, and the profile of the first trenches 136t.

The first pre-spacer film 151p may be formed of, for example, silicon oxide. For example, the first pre-spacer film 151p may be formed by atomic layer deposition (ALD).

Figure 9:
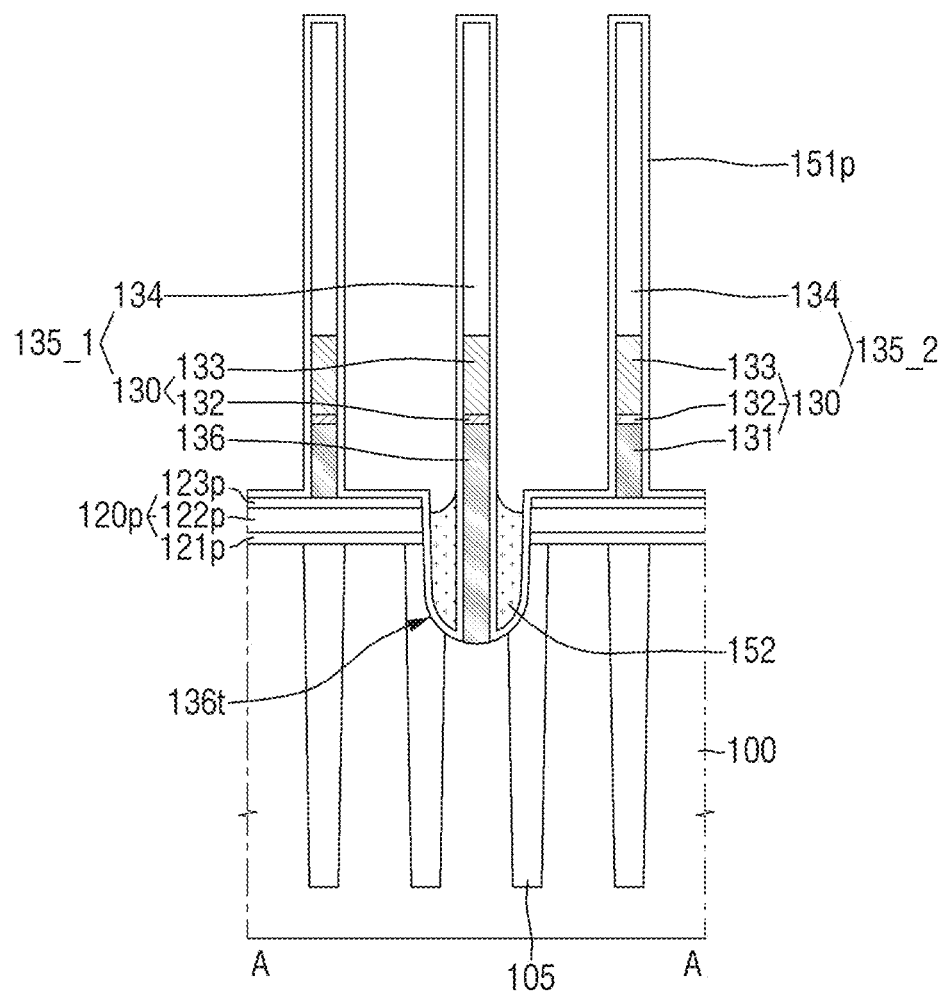

Referring to FIG. 9, second spacers 152 may be formed. The second spacers 152 may be formed in the first trenches 136t, on the first pre-spacer film 151p. The second spacers 152 may fill parts of the first trenches 136t that are not filled with the first pre-spacer film 151p.

For example, a second pre-spacer film may be formed on the first pre-spacer film 151p. In some embodiments, the second spacers 152 may include a different material from the first pre-spacer film 151p. The second spacers 152 may include a material having an etching selectivity with respect to the first pre-spacer film 151p. The second spacers 152 may include silicon nitride. Thereafter, the second pre-spacer film may be partially removed using the first pre-spacer film 151p as an etching stopper film. As a result, the second spacers 152, which fill the first trenches 136t, may be formed. The partial removal of the second pre-spacer film may be performed by, for example, a wet etching process using phosphoric acid ($H_3PO_4$), but the present disclosure is not limited thereto.

FIG. 9 illustrates that at least parts of the top surfaces of the second spacers 152 are concave toward the substrate 100, but the present disclosure is not limited thereto.

Figure 10:
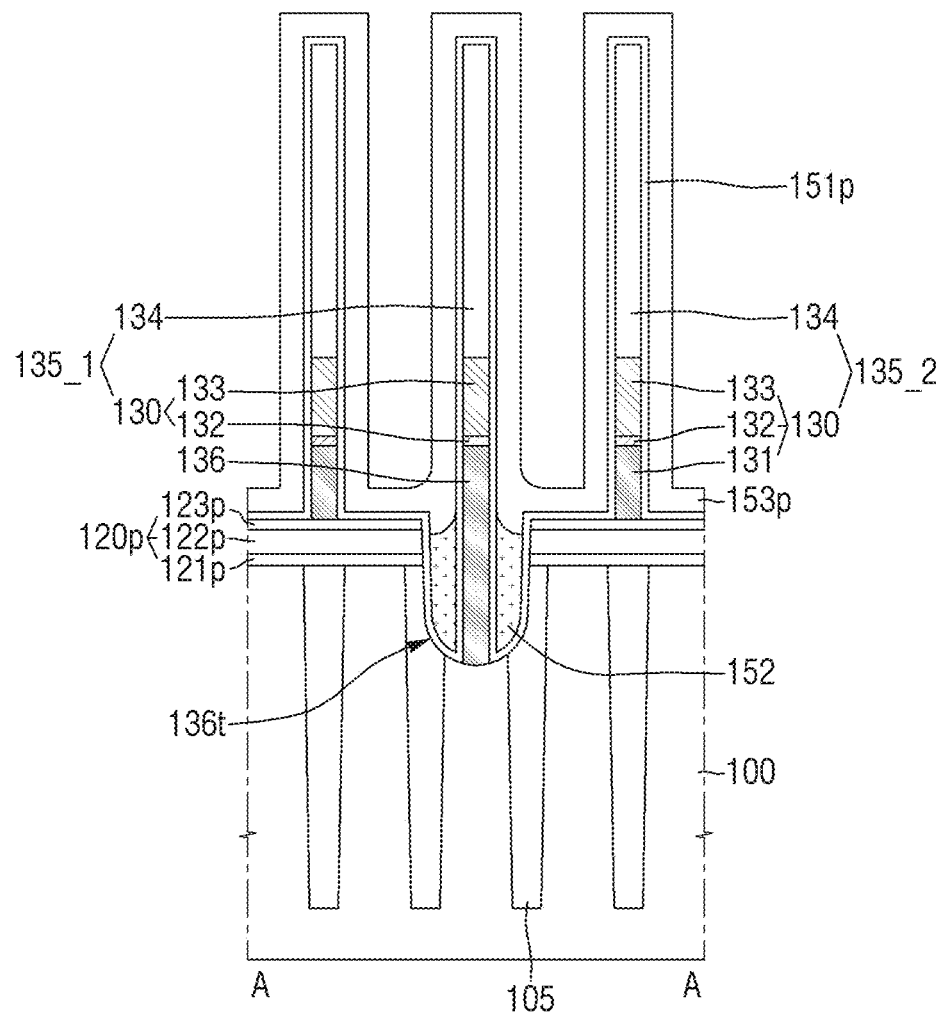

Referring to FIG. 10, a third pre-spacer film 153p may be conformally formed. The third pre-spacer film 153p may extend along the side surfaces and the top surfaces of the first pre-spacer film 151p and the top surfaces of the second spacers 152.

The third pre-spacer film 153p may include silicon oxide. For example, the third pre-spacer film 153p may be formed by ALD.

In some embodiments, the thickness of the third pre-spacer film 153p may be greater than the thickness of the first pre-spacer film 151p.

Figure 11:
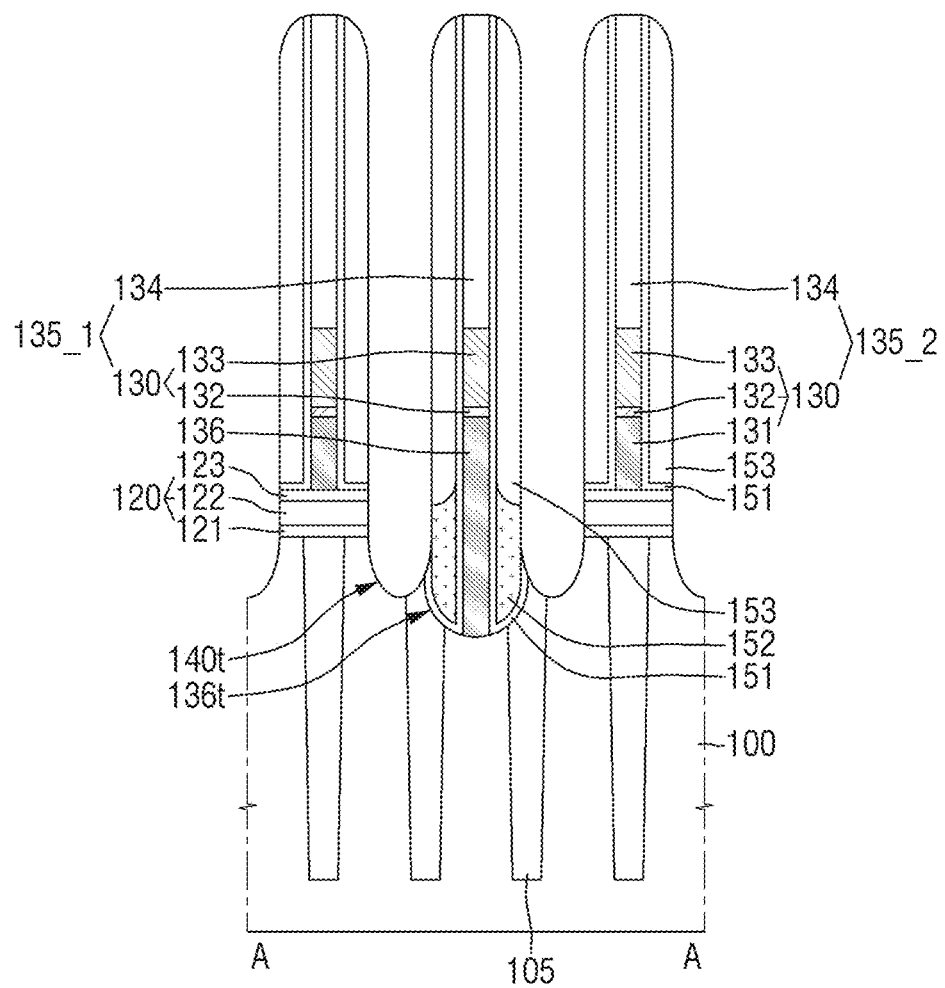

Referring to FIG. 11, contact recesses 140t may be formed between the bitline structures (135_1 and 135_2).

The bottoms of the contact recesses 140t may be formed to be lower than the top surface of the substrate 100. For example, the contact recesses 140t may be formed in the active regions AR (of FIG. 1) of the substrate 100. The contact recesses 140t may expose parts of the active regions AR through the pre-insulating patterns 120p (of FIG. 10). As a result, insulating patterns 120 may be formed. In some embodiments, the contact recesses 140t may expose both ends of each of the active regions AR.

During the formation of the contact recesses 140t, the third pre-spacer film 153p (of FIG. 10) and the first pre-spacer film 151p (of FIG. 10) may be partially removed. For example, the third pre-spacer film 153p (of FIG. 10) and the first pre-spacer film 151p (of FIG. 10) may be partially removed from the top surfaces of the bitline structures (135_1 and 135_2). As a result, first spacers 151 and third spacers 153 may be formed.

Figure 12:
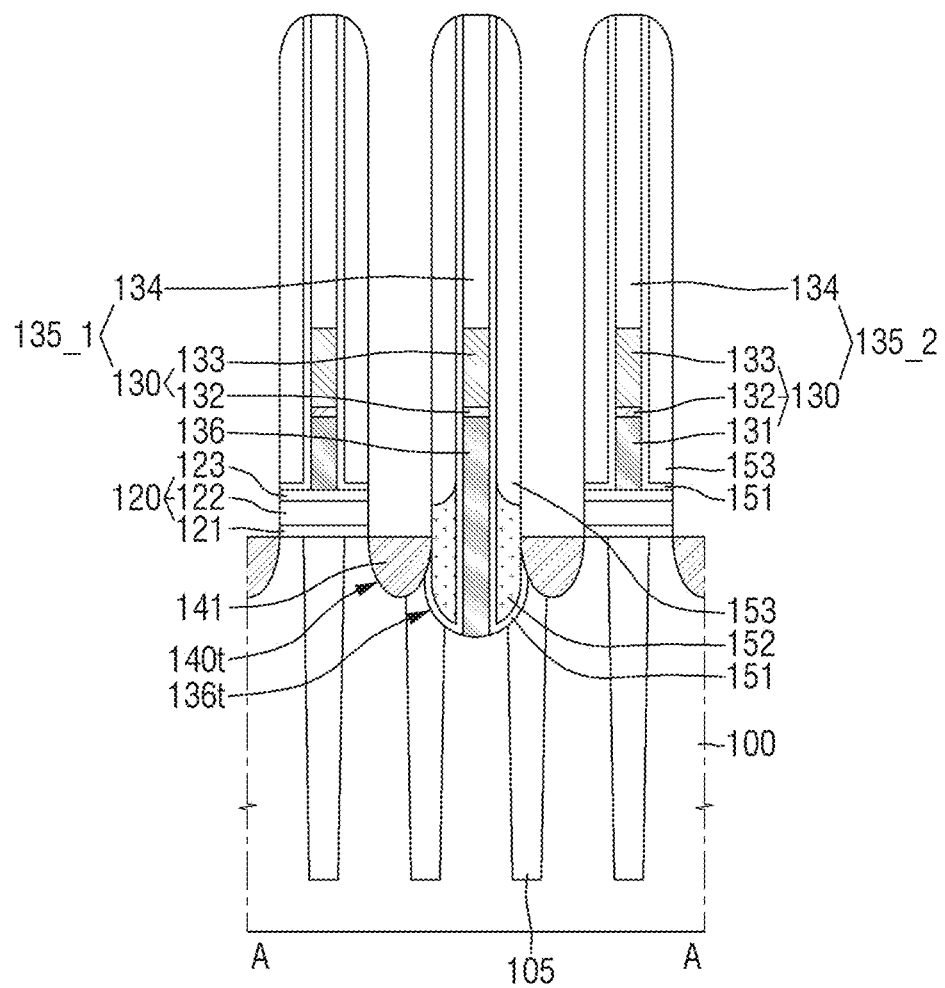

Referring to FIG. 12, first portions 141 of buried contacts 140 may be formed.

For example, first pre-buried contacts may be formed on the contact recesses 140t. Thereafter, an etch-back process may be performed such that the top surfaces of the first pre-buried contacts may fall on substantially the same plane as the top surface of the substrate 100.

In another example, the first portions 141 may be epitaxial layers grown from parts of the substrate 100 that are exposed by the contact recesses 140t. The first portions 141 may include polysilicon.

Figure 13:
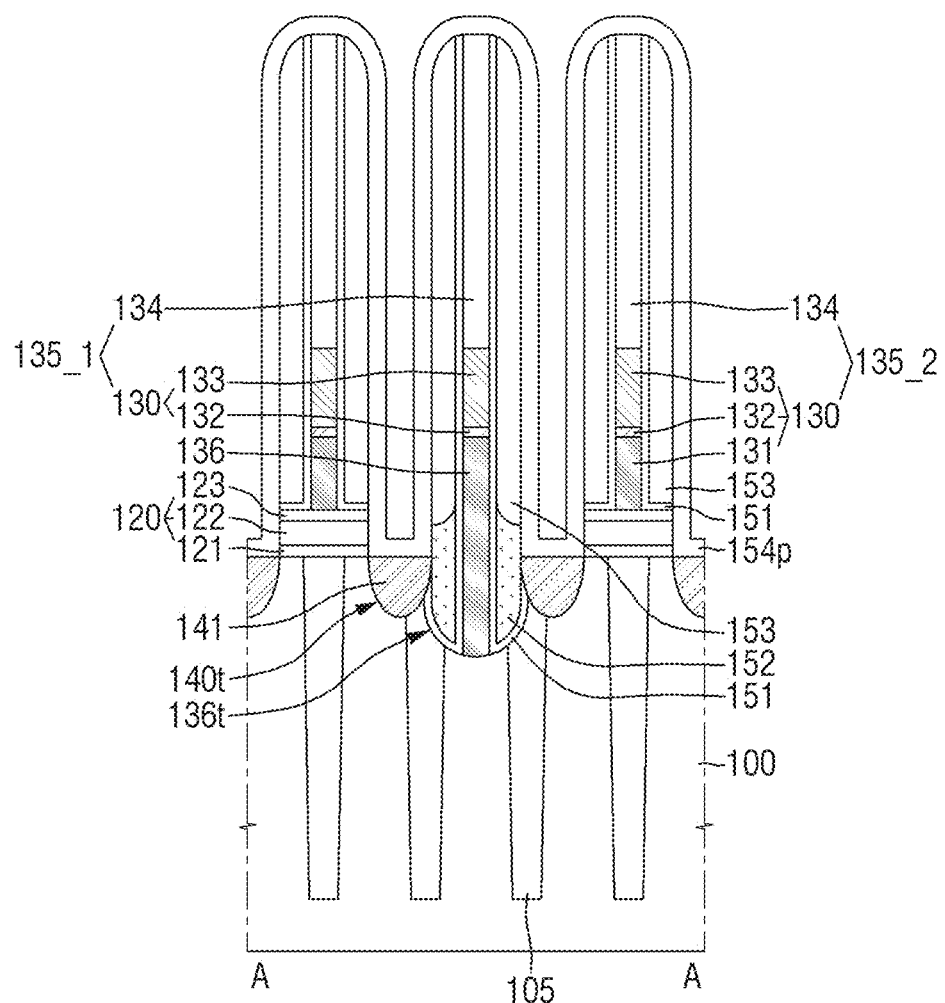

Referring to FIG. 13, a fourth pre-spacer film 154p may be conformally formed. The fourth pre-spacer film 154p may extend along the top surfaces of the first portions 141, the side surfaces of the conductive patterns 130, the side surfaces of the third spacers 153, the top surfaces of the first spacers 151, and the top surfaces of the capping patterns 134.

The fourth pre-spacer film 154p may include silicon oxide. For example, the fourth pre-spacer film 154p may be formed by ALD.

Figure 14:
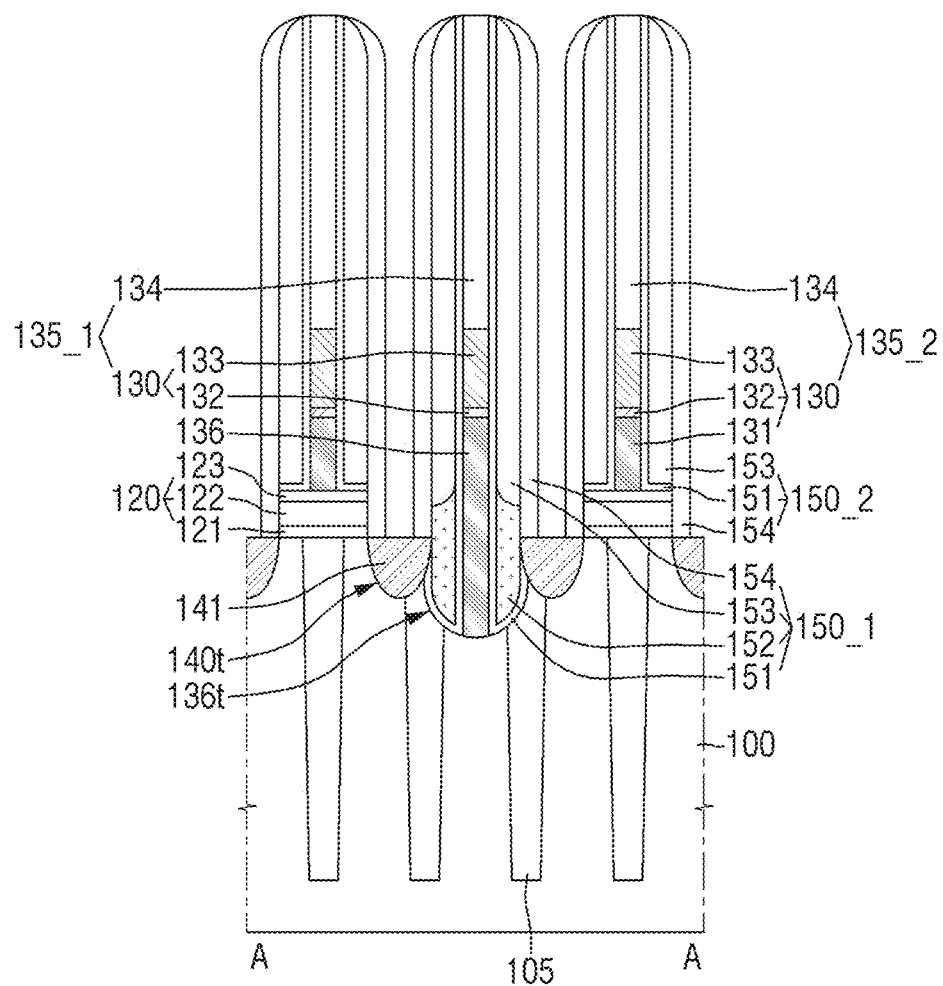

Referring to FIG. 14, the fourth pre-spacer film 154p may be partially removed, thereby forming fourth spacers 154. The fourth pre-spacer film 154p may be partially removed from the top surfaces of the first spacers 151, the top surfaces of the capping patterns 134, and the middle parts of the top surfaces of the first portions 141. As a result, at least parts of the top surfaces of the first portions 141 may be exposed. Also, fourth spacers 154 may be formed. The fourth spacers 154 may extend in a fourth direction DR4, on the top surfaces of the first portions 141.

Figure 15:
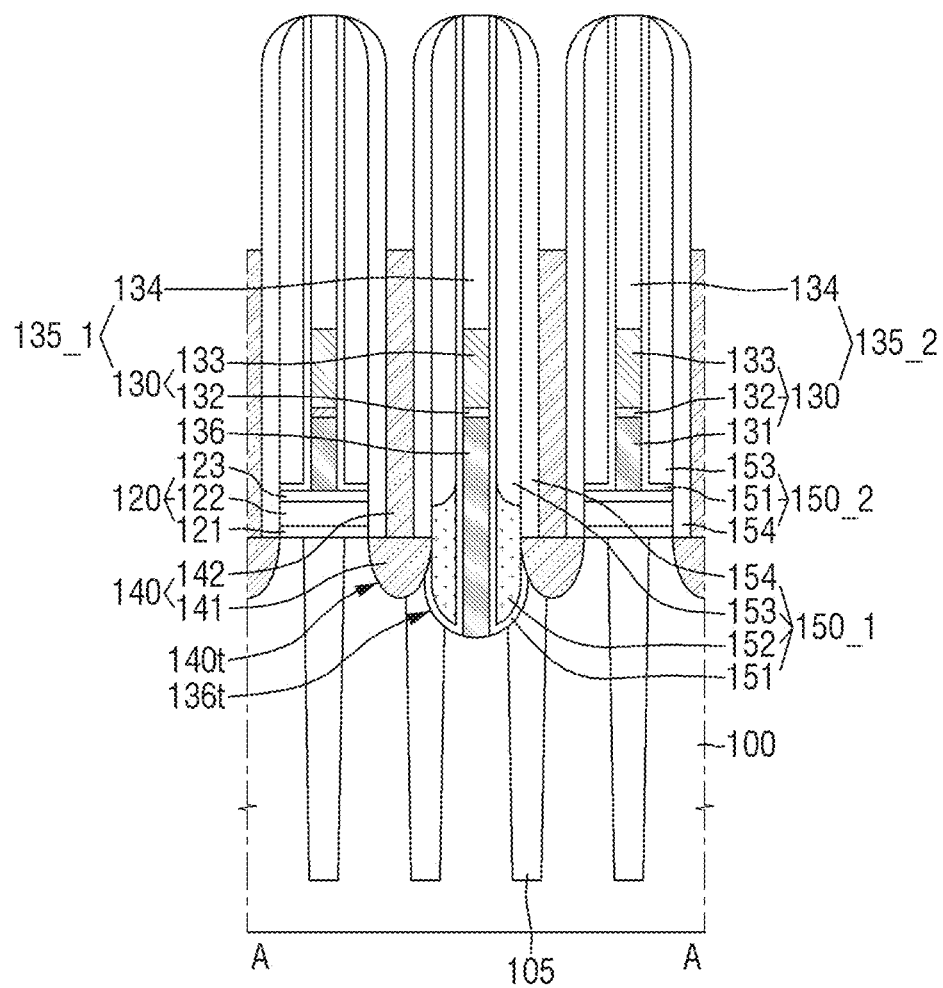

Referring to FIG. 15, second portions 142 may be formed. The second portions 142 may be formed on the first portions 141, between fourth spacers 154 formed on the side surfaces of first bitline structures 135_1 and fourth spacers 154 formed on the side surfaces of second bitline structures 135_2. As a result, the buried contacts 140, which form a plurality of isolated regions, may be formed. The buried contacts 140 may include polysilicon, but the present disclosure is not limited thereto.

Thereafter, referring again to FIG. 2, the silicide layers 145 and the landing pads 160 may be sequentially stacked on the buried contacts 140.

Thereafter, the second trenches 180t may be formed in the landing pads 160. That is, the landing pads 160 may be patterned by the second trenches 180t. As a result, the landing pads 160, which form a plurality of isolated regions, may be formed. The second trenches 180t may be formed by etching parts of the bitline structures (135_1 and 135_2) and parts of the spacer structures (150_1 and 150_2).

Thereafter, the interlayer insulating film 180 may be formed on the top surfaces of the landing pads 160 to fill the second trenches 180t.

Thereafter, parts of the top surfaces of the landing pads 160 may be exposed by patterning the interlayer insulating film 180.

Thereafter, the capacitor structure 190 may be formed on the interlayer insulating film 180. The capacitor structure 190 may be connected to the exposed parts of the top surfaces of the landing pads 160, on the interlayer insulating film 180. In this manner, a semiconductor device with improved operating properties can be provided.

Figure 16:
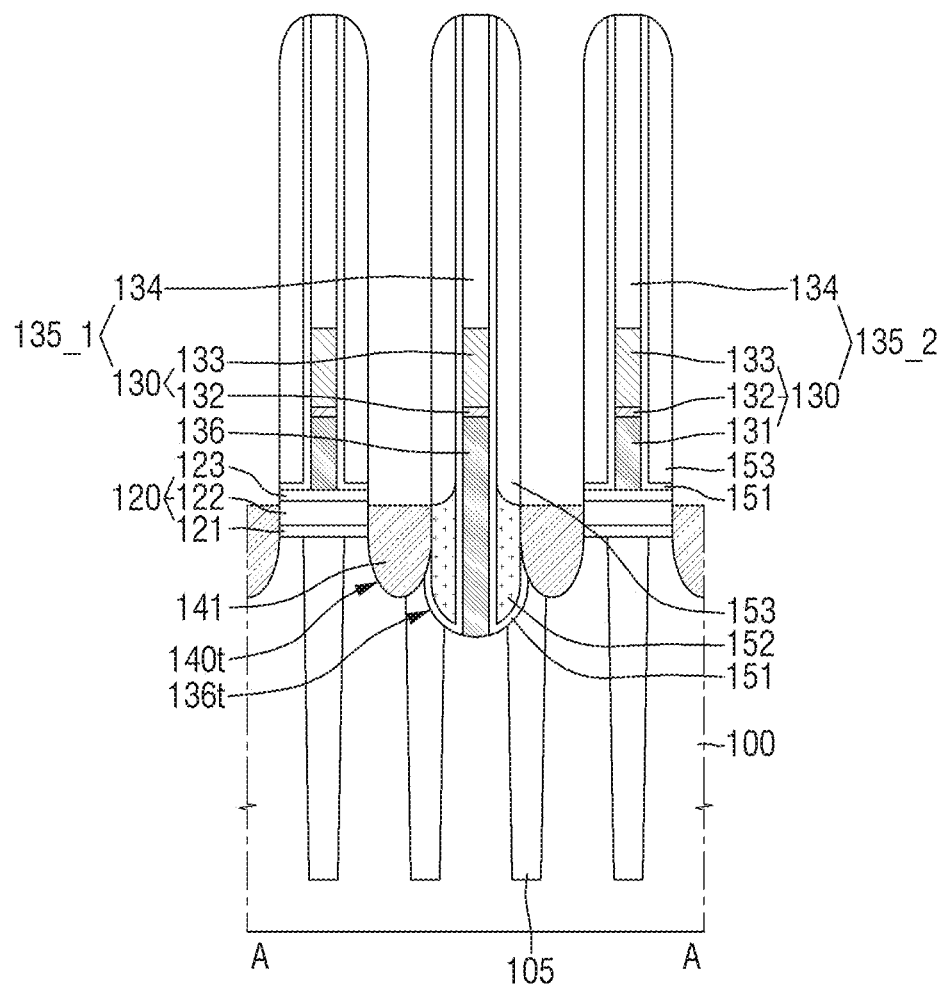
FIG. 16 is a cross-sectional view illustrating a method of fabricating a semiconductor device according to some embodiments of the present disclosure.

FIG. 16 is a cross-sectional view illustrating a method of fabricating a semiconductor device according to some embodiments of the present disclosure. Specifically, FIG. 16 is a cross-sectional view taken along line A-A of FIG. 1 and illustrates a step performed after the step of FIG. 11.

Referring to FIG. 16, first portions 141 of buried contacts may be formed. The top surfaces of the first portions 141 may be located above the top surface of a substrate 100.

For example, first pre-buried contacts may be formed on contact recesses 140t. Thereafter, an etch-back process may be performed such that the top surfaces of the first pre-buried contacts may be located above the top surface of the substrate 100.

In another example, the first portions 141 may be epitaxial layers grown from parts of the substrate 100 that are exposed by the contact recesses 140t. The first portions 141 may be grown from the substrate 100 to be located above the top surface of the substrate 100. The first portions 141 may include polysilicon.

Figure 17:
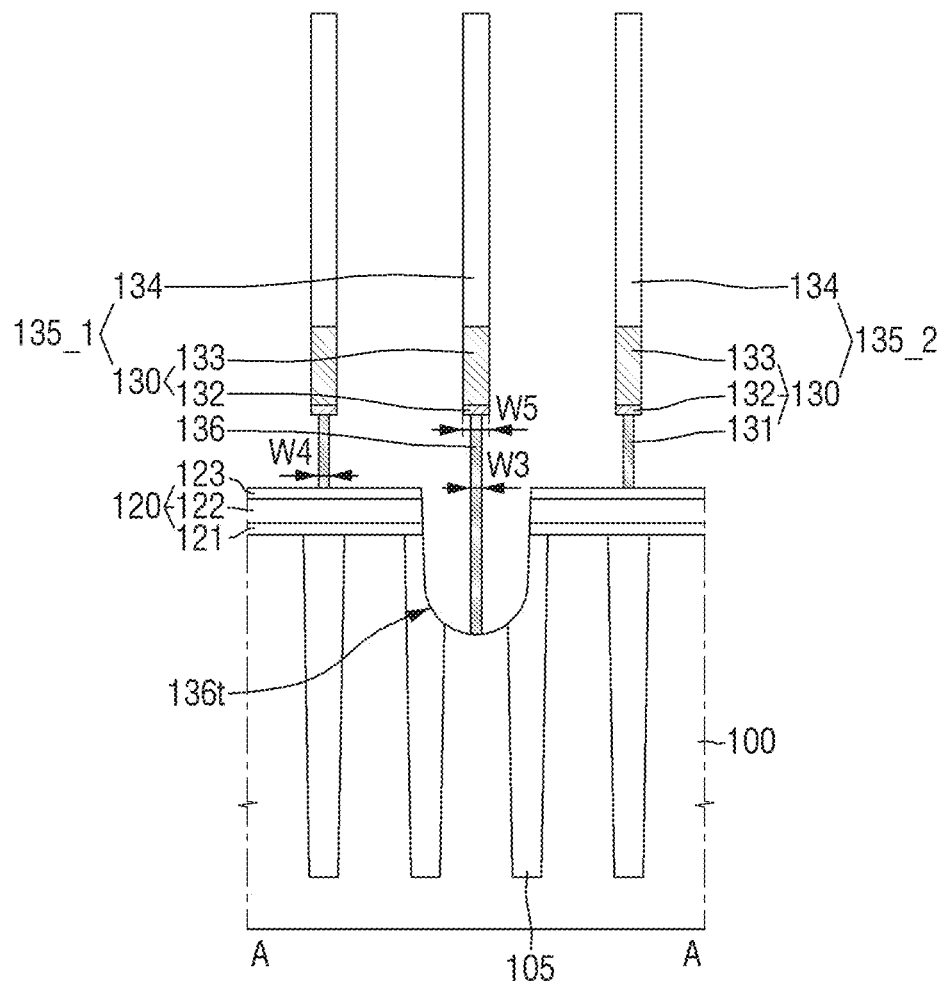
FIG. 17 is a cross-sectional view illustrating a method of fabricating a semiconductor device according to some embodiments of the present disclosure.

FIG. 17 is a cross-sectional view illustrating a method of fabricating a semiconductor device according to some embodiments of the present disclosure. Specifically, FIG. 17 is a cross-sectional view taken along line A-A of FIG. 1 and illustrates a step performed after the step of FIG. 7.

Referring to FIG. 17, the width of direct contacts 136 may be reduced.

For example, a trimming process may be performed on the direct contacts 136. That is, an anisotropic etching process may be performed on the direct contacts 136. That is, a width W3 of the direct contacts 136 may be smaller than the width of bitline structures (135_1 and 135_2).

A first conductive film 131 may include the same material as the direct contacts 136. The first conductive film 131 and the direct contacts 136 may include polysilicon. Accordingly, the width of the first conductive film 131 may also be reduced. A width W4 of the first conductive film 131 may be smaller than the width of the bitline structures (135_1 and 135_2). The width W4 of the first conductive film 131 may be the same as, or different from, the width W3 of the direct contacts 136.

While some example embodiments have been described, the presented embodiments of the disclosure are to be used in a generic and descriptive sense only and not for purposes of limitation. Those skilled in the art will appreciate that many variations and modifications may be made to embodiments of inventive concepts without substantially departing from the principles of inventive concepts in the present disclosure as defined by the following claims.

What is claimed is:

1. A semiconductor device comprising:
    a substrate including trenches and contact recesses, the contact recesses having a curved surface profile;
    conductive patterns in the trenches, a width of the conductive patterns being smaller than a width of the trenches;
    buried contacts including first portions and second portions on the first portions, the first portions filling the contact recesses, the second portions having a pillar shape, and a width of the second portions being smaller than a width of top surfaces of the first portions; and
    spacer structures on side surfaces of the conductive patterns,
        the buried contacts being spaced apart from the conductive patterns by the spacer structures,
        the spacer structures including first spacers and second spacers,
        a bottom surface of the first spacers contacting with the top surface of the first portions of the buried contacts,
        the first spacers extending along the second portions of the buried contacts at outermost parts of the spacer structures,
        the second spacers extending along the side surfaces of the conductive patterns and the trenches,
        the second spacers contacting the conductive patterns, and
        the first spacers including silicon oxide.

2. The semiconductor device of claim 1, wherein a width of the first portions of the buried contacts decreases away from a top surface of the substrate.

3. The semiconductor device of claim 1, wherein boundaries between the first portions of the buried contacts and the second portions of the buried contacts are coplanar with bottom surfaces of the first spacers, and the second spacers include silicon oxide.

4. The semiconductor device of claim 1, wherein
    the spacer structures further include third spacers and fourth spacers,
    the third spacers are on the second spacers and fill the trenches,
    the fourth spacers are on the third spacers and fill gaps between the first spacers and the second spacers, and
    the fourth spacers include silicon oxide.

5. The semiconductor device of claim 4, wherein at least parts of the first spacers are in contact with the third spacers.

6. The semiconductor device of claim 4, wherein the top surfaces of the first portions of the buried contacts are located below uppermost top surfaces of the third spacers.

7. The semiconductor device of claim 4, wherein at least parts of the first portions of the buried contacts are in contact with the third spacers.

8. The semiconductor device of claim 4, wherein the third spacers include silicon nitride.

9. The semiconductor device of claim 1, wherein
    the conductive patterns include direct contacts and bitline structures,
    the direct contacts are on the trenches,
    the bitline structures are on the direct contacts, and
    top surfaces of the direct contacts are located above the top surfaces of the first portions of the buried contacts.

10. The semiconductor device of claim 9, wherein a width of the direct contacts is smaller than a width of the bitline structures.

11. The semiconductor device of claim 1, further comprising:
    landing pads on the buried contacts; and
    a capacitor structure on the landing pads, wherein
    the capacitor structure is electrically connected to the landing pads and the buried contacts.

12. A semiconductor device comprising:
    a substrate including isolation films and active regions defined by the isolation films, the active regions being arranged in a first direction;
    a plurality of buried contacts connected to the active regions and arranged in a second direction, the second direction different from the first direction,
        the plurality of buried contacts including first portions and second portions on the first portions,
        the first portions being depressed into the isolation films and the active regions,
        the second portions having a smaller width than top surfaces of the first portions, and having a pillar shape,
    a width of the first portions decreasing away from a top surface of the substrate;
    a plurality of bitline structures between the plurality of buried contacts and extending in a third direction across the active regions, the third direction intersecting the second direction,
        the plurality of bitline structures including first bitline structures overlapping the active regions and second bitline structures overlapping the isolation films,
        the first bitline structures and the second bitline structures being arranged such that the first portions of the plurality of buried contacts are between the first bitline structures and the second bitline structure;
    direct contacts; and
    spacer structures extending in the third direction along side surfaces of plurality of bitline structures,
        the spacer structures including first spacers, the first spacers including silicon oxide, the first spacers being at outermost parts of the spacer structures and extending along side surfaces of the second portions of the plurality of buried contacts, wherein
    the spacer structures include first spacer structures on side surfaces of the first bitline structures and second spacer structures on side surfaces of the second bitline structures,
    the first spacer structures are on the first portions of the buried contacts,
    the second spacer structures are spaced apart from the first spacer structures by the second portions of the buried contacts,
    the substrate further includes trenches formed in the isolation films and the active regions,
    the direct contacts are in the trenches,
    a width of the direct contacts is smaller than a width of the trenches in the second direction,
    the spacer structures further include second spacers extending along side surfaces of the first bitline structures, side surfaces of the direct contacts, the trenches and along side surfaces of the second bitline structures, the spacer structures further include third spacers between the first spacers and the second spacers, at least parts of the first portions of the buried contacts are between the first spacers and second spacers that extend along the trenches, and the second spacers and the third spacers include silicon oxide.

13. The semiconductor device of claim 12, wherein the spacer structures further include fourth spacers on the second spacers extending along the trenches, the fourth spacers fill the trenches and include silicon nitride, and at least parts of the first spacers are in contact with the fourth spacers.

14. The semiconductor device of claim 12, wherein the width of the direct contacts is smaller than a width of the first bitline structures.

15. The semiconductor device of claim 12, wherein the top surfaces of the first portions of the buried contacts are placed on a same plane as the top surface of the substrate.

16. The semiconductor device of claim 12, wherein the top surfaces of the first portions of the buried contacts are above the top surface of the substrate.

17. A semiconductor device comprising:

a substrate including gate trenches;

gate electrodes filling parts of the gate trenches and extending in a first direction;

source/drain regions on side surfaces of the gate electrodes;

buried contacts electrically connected to the source/drain regions and arranged in the first direction, the buried contacts including first portions and second portions, and in a cross-sectional view taken along the first direction, the first portions being depressed into the substrate and having a semielliptical shape that bulges toward the substrate, and the second portions having a pillar shape with a smaller width than top surfaces of the first portions;

landing pads on the buried contacts;

a capacitor structure on the landing pads and electrically connected to the landing pads and the buried contacts;

bitline structures extending in a second direction between the buried contacts, the second direction intersecting the first direction, the bitline structures being spaced apart from one another in the first direction, and the bitline structures including conductive patterns and capping patterns on the conductive patterns; and spacer structures on side surfaces of the bitline structures, the spacer structures extending in the second direction, the spacer structures including first spacers and second spacers including silicon oxide, the second portions of the buried contacts being spaced apart from the bitline structures by the spacer structures, the first spacers contacting the second portions of the buried contacts, the second spacers contacting the side surfaces of the bitline structures, and boundaries between the first portions and the second portions of the buried contacts being coplanar with bottom surfaces of the first spacers.

18. The semiconductor device of claim 17, wherein top surfaces of the first portions of the buried contacts are placed on a same plane as the top surface of the substrate.

19. The semiconductor device of claim 1, wherein the width of the second portions at an interface with the first portions is smaller than the width of the top surfaces of the first portions, the pillar shape of the second portions has a constant width from a lower region to an upper region thereof such that the second portions extend in a direction vertical to an upper surface of the substrate.

20. The semiconductor device of claim 17, wherein the spacer structures further include third spacers, and the third spacers are on the second spacers.

* * * * *